US010410732B1

(12) United States Patent
Eliash et al.

(10) Patent No.: US 10,410,732 B1
(45) Date of Patent: Sep. 10, 2019

(54) FAILURE PREDICTION BY CELL PROBING

(71) Applicant: Western Digital Technologies, Inc., San Jose, CA (US)

(72) Inventors: Tomer Tzvi Eliash, Kfar Saba (IL); Arthur Shulkin, Yavne (IL); James Yin Tom, Tel Aviv (IL); Eran Sharon, Rishon Lezion (IL)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 15/985,588

(22) Filed: May 21, 2018

(51) Int. Cl.
*G11C 16/10* (2006.01)
*G11C 16/22* (2006.01)
*G11C 16/34* (2006.01)
*G11C 29/00* (2006.01)

(52) U.S. Cl.
CPC .......... *G11C 16/3495* (2013.01); *G11C 16/10* (2013.01); *G11C 16/22* (2013.01); *G11C 16/3459* (2013.01); *G11C 29/70* (2013.01); *G11C 2216/16* (2013.01)

(58) Field of Classification Search
CPC ............ G11C 16/349; G11C 29/50004; G11C 29/56008
See application file for complete search history.

(56) References Cited

U.S. PATENT DOCUMENTS

| 7,242,615 | B2 * | 7/2007 | Nagashima | ............ | G11C 16/06 365/185.09 |
| 8,036,044 | B2 * | 10/2011 | Dong | ................... | G11C 16/344 365/185.18 |
| 9,299,443 | B1 * | 3/2016 | Dong | ..................... | G11C 16/10 |
| 2007/0201274 | A1 | 8/2007 | Yu et al. | | |
| 2008/0155184 | A1 | 6/2008 | Gorobets et al. | | |
| 2011/0063918 | A1 | 3/2011 | Pei et al. | | |
| 2011/0310671 | A1 | 12/2011 | Lee et al. | | |
| 2015/0262700 | A1 | 9/2015 | Yong et al. | | |

OTHER PUBLICATIONS

International Search Report and Written Opinion from PCT/US2019/016915, dated May 21, 2019, 11 pages.

* cited by examiner

*Primary Examiner* — Harry W Byrne
*Assistant Examiner* — R Lance Reidlinger
(74) *Attorney, Agent, or Firm* — Morgan, Lewis & Bockius LLP (57) ABSTRACT

Systems and methods are described for predicting potential failures in flash memory devices by probing for memory cells with marginal programming characteristics. A method includes receiving a write request. The method also includes applying a predetermined number of programming pulses to a plurality of memory cells within a block of a flash memory device. The method also includes applying a verify pulse to each respective one of the plurality of memory cells. The method also includes storing programming status of the plurality of memory cells into a set of latches. The method also includes determining, based on the stored programming status, a total number of memory cells within the block that fall outside of one or more predetermined expected ranges. The method also includes identifying the block as a block in risk when the total number of memory cells satisfies a predetermined risk threshold.

20 Claims, 6 Drawing Sheets

FIG. 2A

Cells before programming to "B" state

Case 1: Cells program slower than expected after N pulses

Case 2: Cells program faster than expected after N pulses

FAILURE PREDICTION BY CELL PROBING

BACKGROUND

To compensate for errors caused by memory array defects or peripheral defects, NAND flash memory products deploy various countermeasures to detect and correct such errors. Often, these countermeasures adversely affect the performance parameters of the NAND flash memory product. For example, I/O performance, drive capacity, and/or drive endurance may be negatively affected.

BRIEF DESCRIPTION OF THE DRAWINGS

A detailed description will be made with reference to the accompanying drawings.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology may be practiced without these specific details. In some instances, structures and components are shown in block diagram form in order to avoid obscuring the concepts of the subject technology. Like components are labeled with identical element numbers for ease of understanding.

One or more implementations of methods and systems are provided for failure prediction by cell probing. Since the characteristics of NAND flash may be tested and recorded at manufacture or assembly time, an expected program range may be determined for a predetermined number of programming pulses. When the NAND flash receives a write operation, the predetermined number of programming pulses may be applied to word lines in a block, and a verify pulse may be applied to compare a current programming status against the expected program range, which may be adjusted according to a wear level of the block or other factors. Hardware circuits such as counters may count a total number of memory cells in the block that fall outside the expected program range. When the total number satisfies a risk threshold, the block may be identified as a block in risk, and mitigating actions may be carried out, such as relocating data in the block. When the total number does not satisfy the risk threshold, the block may be identified as a usable block, which may postpone or override block retirement according to wear level indicators. It should be noted that hardware circuits such as counters described herein may be implemented using hardware, software (including firmware), or a combination of hardware and software (including firmware).

The subject technology provides several performance benefits that improve the functionality of a computer. By using hardware circuits to count the total number of memory cells outside of the expected program range, a separate read verify operation may be omitted. Thus, a storage controller coupled to NAND flash with such hardware circuits can issue continuous programming operations to the NAND flash. This improves I/O bandwidth and performance by avoiding interleaved reads for verifying the programming status, which would otherwise stall the programming operations.

Further, since the NAND flash tracks the total number of memory cells outside the expected program range, this number can be used as a health indicator to improve NAND flash reliability. For example, if the health indicator satisfies a predetermined risk threshold, an associated block may be identified as a block at risk, and data within the block at risk can be relocated to a usable block before uncorrectable errors occur.

Even further, by using the health indicator to narrowly target blocks at risk, simpler failure prediction algorithms such as targeting and skipping entire word lines at risk can be avoided, which also helps to optimize available storage capacity. In addition, since the health indicator may be used to improve NAND flash reliability, the health indicator may substitute for or replace other redundancy data, such as RAID parity data, which further helps to optimize available storage capacity in the NAND flash.

Yet further, the health indicator may be used to extend the endurance of the NAND flash. For example, the health indicator can be used to identify aged blocks that still perform like younger blocks, or within an expected program range for a lower wear state. These high performing aged blocks may service I/O requests beyond their scheduled end of life, which may be calibrated based on worst-case block endurance. Thus, blocks that would normally be retired can continue to service I/O requests according to the health indicator for each block, helping to improve NAND flash endurance.

Thus, NAND flash with failure prediction by cell probing provides several performance advantages that improve the functioning of the NAND flash. In turn, a storage device that uses one or more such NAND flash memory devices is also provided with improved functioning. A host computer that interfaces with the storage device is also provided with improved functioning. Thus, the NAND flash provides performance benefits that improve the functioning of a storage device controller and a host computer.

Figure 1:
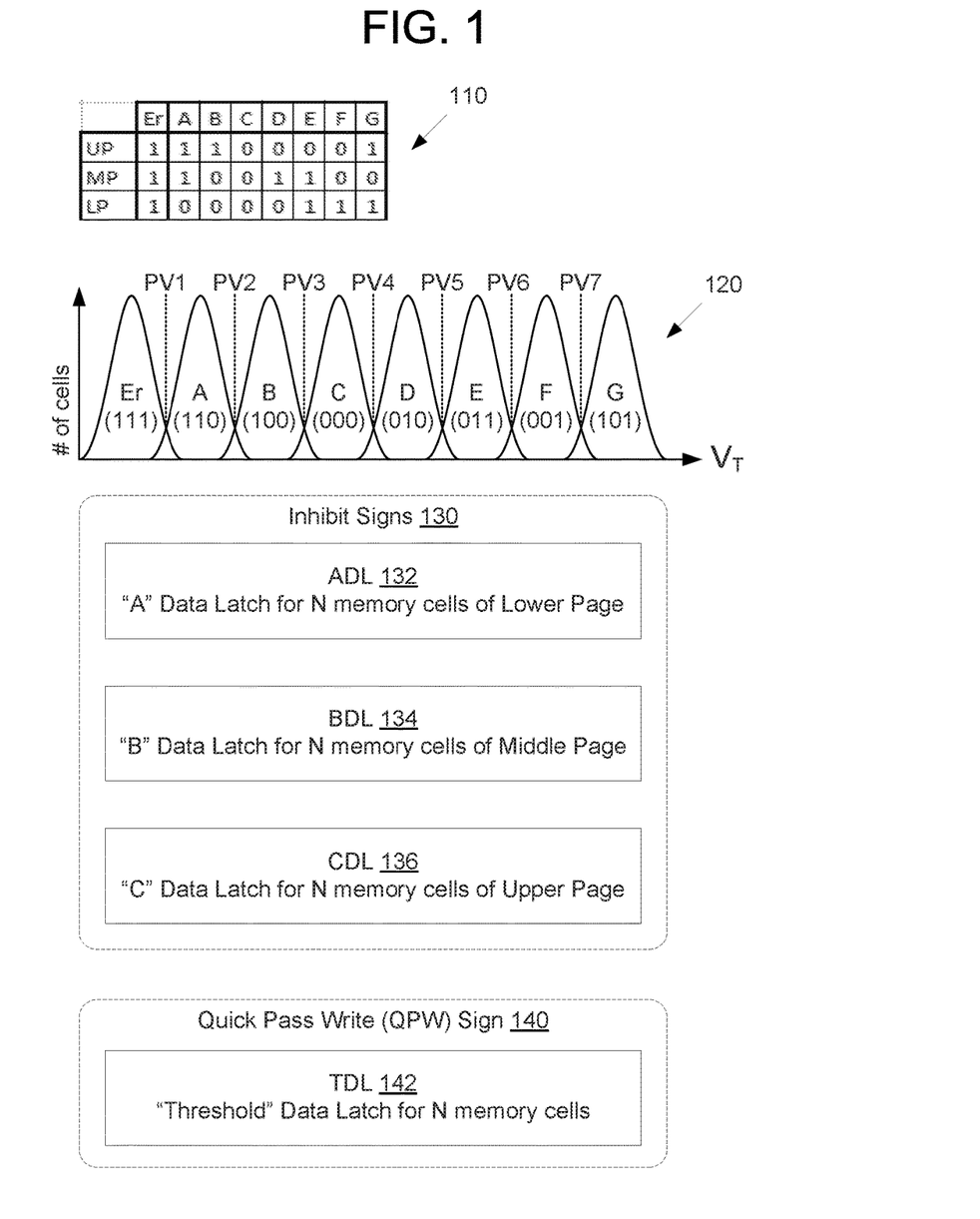
FIG. 1 is a diagram illustrating an example state distribution and data latches for tracking flash memory programming status.

FIG. 1 is a diagram illustrating an example state distribution and data latches for tracking flash memory programming status. FIG. 1 includes binary coding 110, distribution 120, inhibit signs 130, and quick pass write (QPW) sign 140. Inhibit signs 130 includes a first data latch or A data latch (ADL) 132, a second data latch or B data latch (BDL) 134, and a third data latch or C data latch (CDL) 136. QPW sign 140 includes a threshold data latch or T data latch (TDL) 142.

Binary coding 110 illustrates an example coding for triple level cells (TLC), which can represent 3 bits of data by storing 2^3 or 8 possible program states per memory cell, or from an Er (erased) state to a G state. Accordingly, a word line may utilize three pages that include a lower page (LP), a middle page (MP), and an upper page (UP). As shown in binary coding 110, the coding may be a Gray code where adjacent states differ by one bit. For example, the code for the erased state (111) differs from the adjacent A state (110) by the LP bit. While TLC is illustrated in FIG. 1, it should be understood that multi-level cell (MLC), quad level cell (QLC), X5, or memory cells with any number of states may also be utilized.

Distribution 120 illustrates an example distribution of program states. For example, the first peak may correspond to an erased (Er) state, the second peak may correspond to a state A, the third peak may correspond to a state B, and so forth until state G. Note that a scale for the vertical axis may be logarithmic.

When memory cells are to be programmed to one of seven possible states, A through G, a respective program verify voltage PV1 through PV7 may be utilized to confirm whether the memory cells have reached the desired state. For example, programming and verify pulses may be alternated until the last verify pulse indicates that all of the programmed memory cells meet or exceed the program verify voltage for the desired program state. PV1 through PV7 may be set to default values and may be further adjusted as the flash memory ages and the peaks in distribution 120 shift and widen.

To program word lines for a particular block, a set of data latches (e.g., ADL 132, BDL 134, and CDL 136) may be provided for a memory die to store information regarding the respective LP, MP, and UP. While three latches for TLC memory are shown in FIG. 1, any number of latches may be provided, or a different hardware configuration for storing memory cell status may be utilized. Each of ADL 132, BDL 134, and CDL 136 may include 16 kilobytes of data, or 128 kilobits of data, and may contain data concerning the current and target states for programming N memory cells. N may depend on the specific physical layout of the flash memory. Thus, the combination of ADL 132, BDL 134, and CDL 136 provides inhibit signs 130, or whether a memory cell has reached an inhibited state in which the current state has reached the target state and the memory cell should be ignored for further programming pulses. In some aspects of the present technology, an inhibited cell is indicated by setting the target program state to the erased (Er) state.

Additionally, a data latch TDL 142 is also provided, which may contain the same number of bits as ADL 132, BDL 134, and CDL 136. TDL 142 may include information concerning programming progress with respect to voltage thresholds of memory cells. For example, if bits for a particular memory cell associated with ADL 132, BDL 134, and CDL 136 indicate a target state "A", then corresponding bits in TDL 142 may include information on whether the current programming state has reached a voltage threshold for the target state "A." Thus, the bits in TDL 142 may include flag bits that indicate whether the current programming state has met an "AVL" threshold, or an A state voltage low threshold, prior to reaching a target program verify voltage. For example, the flag bits may be raised for memory cells 230A in the "Pre-A" state that has not yet fully reached PV1, as shown in distribution 220. In some aspects of the subject technology, the flag bits may also indicate whether the current programming state has met an "AVH" threshold, or an A state voltage high threshold.

If bits in TDL 142 indicate that a current programming state has met a voltage low threshold for a memory cell, then the memory cell is identified as being affected by quick pass write (QPW), as indicated by QPW sign 140. Cells affected by QPW receive weaker, lower power, and/or shorter programming pulses compared to other cells for the next set of programming pulses, and the QPW cells may become inhibited. This may help to avoid over-programming past the optimal range indicated by the state voltage low and high thresholds. Further, QPW sign 140 can indicate that cells affected by QPW as identified in TDL 142 are close to reaching their target state and will soon be inhibited. Thus, a combination of inhibit signs 130 and QPW sign 140 can be used to determine how many memory cells are close to or have already met their target program states.

Figure 2A:
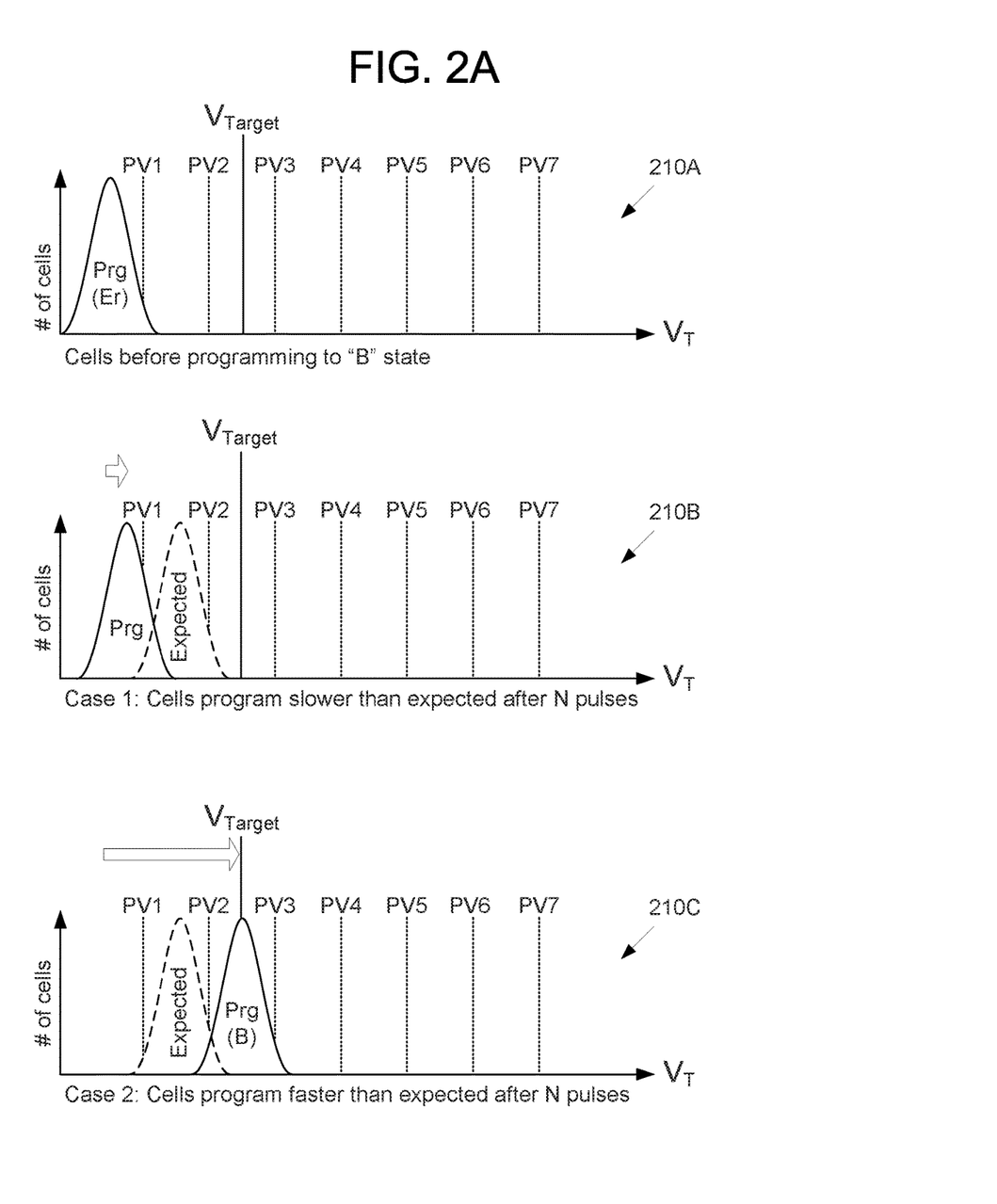
FIG. 2A is a diagram illustrating example state distributions before and after writing a predetermined number of programming pulses.
Figure 2B:
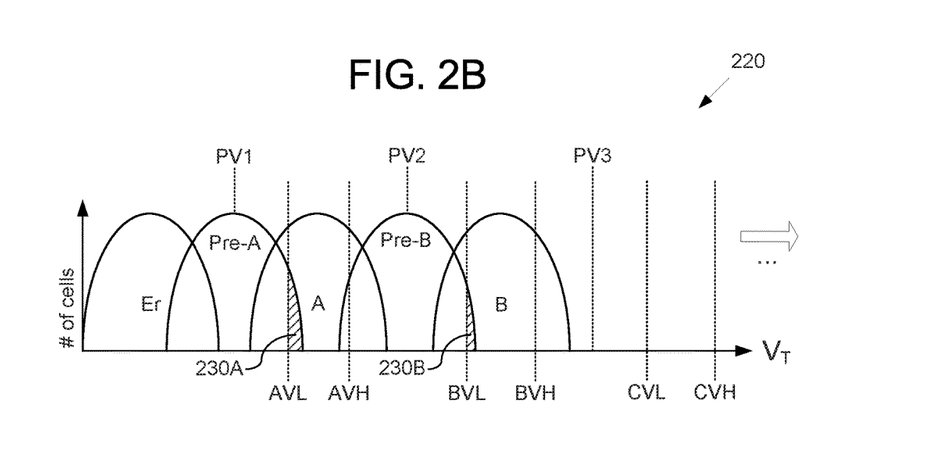
FIG. 2B is a diagram illustrating an identification of quick pass write cells in an example program state distribution.

FIG. 2A is a diagram illustrating example state distributions before and after writing a predetermined number of programming pulses. FIG. 2A includes distribution 210A, distribution 210B, and distribution 210C.

Distribution 210A may represent a distribution of memory cells prior to programming. Thus, as shown in distribution 210A, the memory cells to be programmed or "Prg" are all still in the erased or "Er" state. A target state or Vtarget is shown, which may correspond to the "B" state. Thus, the goal is to program the Prg memory cells so that they reach the Vtarget. As discussed above, by performing testing at manufacture time, an expected programming range or voltage range for a predetermined number of programming pulses may be determined. For example, it may be determined that approximately two (2) pulses are needed to program from Er state to A state, and approximately three (3) pulses are needed to program from A state to B state. Thus, to reach the Vtarget, a number of programming pulses can be estimated, or 2+3=5 pulses.

To compensate for the known effects of aging on blocks, the predetermined voltage ranges may be based on a wear level of the block. However, even after such wear level adjustment, memory cells may not always program as expected according to the expected programming ranges. For example, due to memory array failures, peripheral failures, or other factors, the memory cells may program slower or faster than expected. These cases are described below in conjunction with distribution 210B and 210C.

Distribution 210B illustrates an example case #1 where the memory cells program slower than expected. For example, after applying N=2 pulses to "Prg" memory cells represented in distribution 210A, the distribution may appear as shown in distribution 210B. The "Prg" memory cells are still primarily in the erased or Er state, which is less than the expected position as illustrated by the dotted peak labeled "Expected." When memory cells program slower than expected, this may indicate higher resistance in the word line, or a weakness/short between the word line and another circuit component that slows or impedes programming. Thus, the block containing the word line may be identified as a block in risk.

Distribution 210C illustrates an example case #2 where the memory cells program faster than expected. For example, after applying N=2 pulses to "Prg" memory cells represented in distribution 210A, the distribution may appear as shown in distribution 210C. The "Prg" memory cells are already in the B state, which is more than the expected position as illustrated by the dotted peak labeled "Expected." When memory cells program faster than expected, this may indicate that the memory cells are behaving as aged blocks, or that external peripherals are not working as expected, which may cause over-programming. Thus, the block containing the word line may be identified as a block in risk.

FIG. 2B is a diagram illustrating an identification of quick pass write cells in an example program state distribution. Distribution 220 includes memory cells 230A and memory cells 230B, which correspond respectively to A state cells affected by QPW and B state cells affected by QPW. As shown in distribution 220, there are some memory cells labelled "Pre-A" and "Pre-B" for which a next set of programming pulses will bring the memory cells to the "A" and "B" states respectively. However, some memory cells in "Pre-A" and "Pre-B" are already very close to their target states. These memory cells include memory cells 230A that reach "AVL" in the "Pre-A" state, and memory cells 230B that reach "BVL" in the "Pre-B" state. If a full strength set of programming pulses are applied to memory cells 230A and 230B, they may overshoot their respective target states A and B. Accordingly, memory cells 230A and 230B may be identified as being affected by QPW in TDL 142. When memory cells 230A and 230B are programmed with a lower intensity QPW pulses, the memory cells 230A and 230B may finish programming within the optimal ranges [AVL, AVH] and [BVL, BVH].

Figure 3:
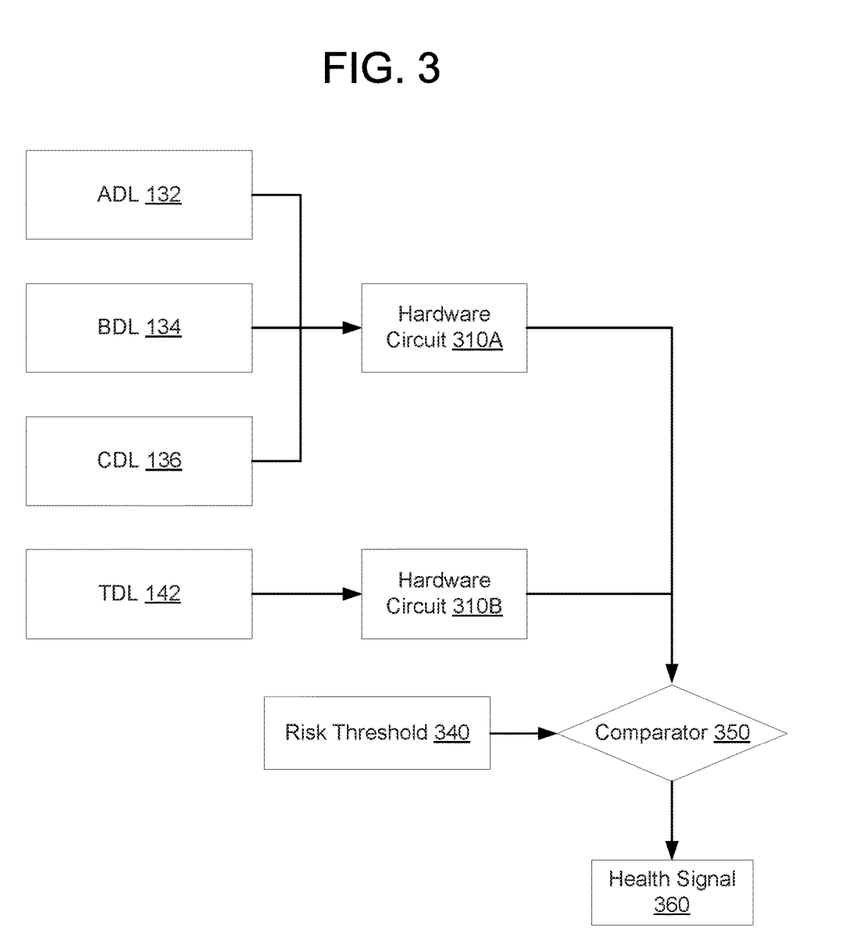
FIG. 3 is a diagram illustrating an exemplary storage device for providing failure prediction by cell probing.

FIG. 3 is a diagram illustrating an exemplary storage device for providing failure prediction by cell probing. With respect to FIG. 3, like numbered elements may correspond to the same elements from FIG. 1. As shown in FIG. 3, ADL 132, BDL 134, and CDL 136 are coupled to a hardware circuit 310A, which may correspond to a hardware counter. Similarly, TDL 142 is coupled to a hardware circuit 310B. Hardware circuits 310A and 310B output to comparator 350. Risk threshold 340 is also coupled to comparator 350. Comparator 350 outputs health signal 360. The specific arrangement of hardware shown in FIG. 3 may differ for various storage devices. It should be noted that components 310A, 310B and 350 may be implemented using hardware, software (including firmware), or a combination of hardware and software (including firmware).

The hardware circuits 310A and 310B may compare the current program state with the expected program state and increase a counter if the current program state is outside of the expected program state. As data is loaded into ADL 132, BDL 134, CDL 136 and TDL 142 and state information is updated during programming, the hardware circuits 310A and 310B can determine whether a memory cell is outside of its expected range and increment a counter accordingly. For example, if ADL 132, BDL 134, CDL 136 indicate that a memory cell is inhibited, then hardware circuit 310A may increment a corresponding counter, and if TDL 142 indicates that a memory cell is affected by QPW, then hardware circuit 310B may increment a corresponding counter. The counters may be summed together by an adder (not shown) to determine a total number of memory cells outside of their respective expected program states.

The comparator 350 takes the sum of the counts from hardware circuits 310A and 310B and compares to a risk threshold 340. The risk threshold 340 may define, for example, a threshold number of memory cells with unexpected program states that would indicate that a given block is a block at risk. The risk threshold 340 may be an absolute value or a relative value, such as a percentage. Further, while risk threshold 340 is described in relation to a block of memory, risk threshold 340 can also be applied to other levels of memory organization.

After comparator 350 performs the comparison, a health signal 360 may be issued. The health signal 360 may for example raise a status flag that is provided back to a controller of a storage system that includes the storage device of FIG. 3. The storage system may include several storage devices, which may each include components similar to those shown in FIG. 3. The raised status flag may indicate that a particular block is at risk due to satisfying risk threshold 340. Satisfying risk threshold 340 may mean that the counts from hardware circuits 310A and 310B meet or exceed risk threshold 340. Once the storage system controller receives the raised status flag, the storage system controller may perform mitigating or remedial actions, such as relocating the data in the identified block at risk to a usable block in the storage device.

Alternatively, when the status flag is not raised, this may indicate that the particular block was programmed without significant error and that the risk threshold 340 was not satisfied. Not satisfying risk threshold 340 may mean that the counts from hardware circuits 310A and 310B total to less than risk threshold 340. Once the storage system controller receives the unraised status flag, the storage system controller may reevaluate a wear level of the particular block. For example, the storage system controller may identify the particular block as a usable block in response to receiving the unraised status flag. The storage system controller may determine whether a wear level of the particular block satisfies an end of life threshold. The end of life threshold may be calibrated for a worst case block. However, since hardware circuits 310A and 310B now provide a more granular view of block health via health signal 360, a more tailored approach to block retirement may be provided. Thus, the storage system controller may postpone a retirement of the particular block based on the unraised status flag identifying the particular block as still healthy despite the particular block satisfying the end of life threshold. In this manner, the endurance of the storage device may be improved.

Figure 4:
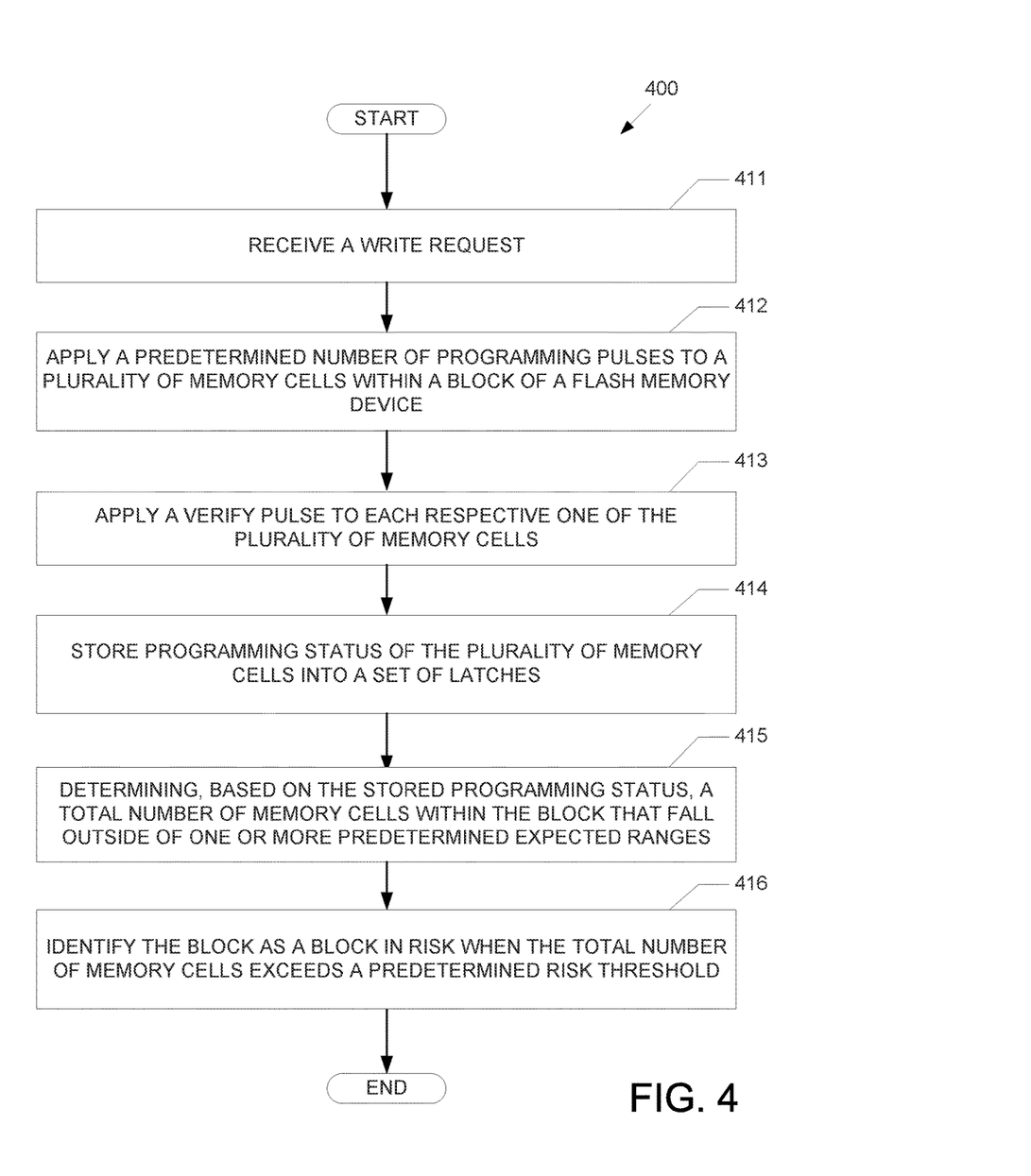
FIG. 4 is a flowchart illustrating an example process for providing failure prediction by cell probing.

FIG. 4 is a flowchart illustrating an example process 400 for providing failure prediction by cell probing, according to aspects of the subject technology. One or more blocks of FIG. 4 may be executed by a computing system (including, e.g., a controller of a flash memory, a data storage controller of an SSD, a processor, or the like). Similarly, a non-transitory machine-readable medium may include machine-executable instructions thereon that, when executed by a computer or machine, perform the blocks of FIG. 4.

Figure 5:
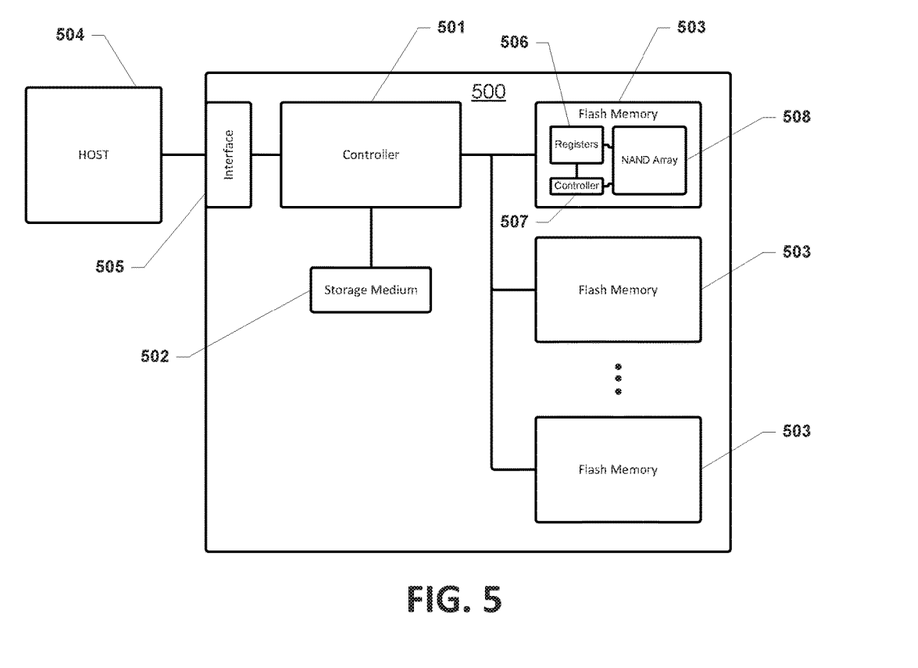
FIG. 5 is a block diagram illustrating components of an example data storage system.

In block 411, referring to FIG. 5, controller 507 receives a write request. For example, controller 507 may receive a write request from controller 501. In turn, controller 507 may determine word lines in a block of NAND array 508 for programming.

In block 412, referring to FIG. 5, controller 507 applies a predetermined number of programming pulses to a plurality of memory cells within a block of a flash memory device 503. For example, programming pulses may be applied to word lines within a block of NAND array 508. The predetermined number of programming pulses may be based on data determined at the manufacture time of flash memory 503. For example, if it is known that at least two programming pulses are needed to program from the Er state to the A state, then the predetermined number may correspond to two. By deferring the verify pulse until a minimum predetermined number of programming pulses are applied rather than applying a verify pulse after every programming pulse, writing performance can also be optimized.

In block 413, referring to FIG. 5, controller 507 applies a verify pulse to each respective one of the plurality of memory cells. For example, a program verify voltage may be applied to test whether the memory cells conduct at the program verify voltage.

In block 414, referring to FIG. 5 and FIG. 3, controller 507 causes programming status of the plurality of memory cells to be stored into a set of latches, or into ADL 132, BDL 134, CDL 136, and TDL 142. These latches may reside within registers 506. As discussed above, ADL 132, BDL 134, and CDL 136 may track programming status of memory cells including a current program state and a target program state/inhibited state, whereas TDL 142 identifies memory cells that are affected by QPW.

In block 415, referring to FIG. 5 and FIG. 3, controller 501 determines, based on the programming status stored in the set of latches (ADL 132, BDL 134, CDL 136, and TDL 142), a total number of memory cells within the block that fall outside of one or more predetermined expected ranges. As discussed above, testing at manufacturing time may identify expected program ranges for a predetermined number of programming pulses. Since block 412 applies a predetermined number of programming pulses, the current programming status identified in the set of latches can be compared against the expected ranges, for example by using hardware circuits 310A and 310B as discussed above. Controller 501 may cause comparator 350 to sum the counts maintained by hardware circuits 310A and 310B to determine the total number of memory cells.

In block 416, referring to FIG. 5 and FIG. 3, controller 501 identifies the block as a block in risk when the total number of memory cells determined in block 415 exceeds risk threshold 340. Thus, controller 501 may cause comparator 350 to compare the total number of memory cells with the risk threshold 340. When the risk threshold 340 is satisfied, then a status flag may be raised in health signal 360. The raised status flag may cause controller 501 to perform mitigating or remedial actions, such as relocating data in the block at risk. Alternatively, the health signal 360 may be stored in a metadata area of the affected block, and controller 501 may retrieve the metadata area to determine the block health. When the status flag is not raised, the unraised flag may be used by controller 501 to postpone retirement of healthy blocks that have reached their end of life threshold.

FIG. 5 is a block diagram illustrating components of an example data storage system, according to aspects of the subject technology. As depicted in FIG. 5, in some aspects, data storage system 500 (e.g., a solid state drive) includes data storage controller 501, storage medium 502, and flash memory 503. Controller 501 may use storage medium 502 for temporary storage of data and information used to manage data storage system 500. Controller 501 may include several internal components (not shown) such as a read-only memory, a flash component interface (e.g., a multiplexer to manage instruction and data transport along a serial connection to flash memory 503), an I/O interface, error correction circuitry, and the like. In some aspects, all of these elements of controller 501 may be integrated into a single chip. In other aspects, these elements may be separated on their own PC board.

In some implementations, aspects of the subject disclosure may be implemented in data storage system 500. For example, aspects of the subject disclosure may be integrated with the function of data storage controller 501 or may be implemented as separate components for use in conjunction with data storage controller 501.

Controller 501 may also include a processor that may be configured to execute code or instructions to perform the operations and functionality described herein, manage request flow and address mappings, and to perform calculations and generate commands. The processor of controller 501 may be configured to monitor and/or control the operation of the components in data storage controller 501. The processor may be a general-purpose microprocessor, a microcontroller, a digital signal processor (DSP), an application specific integrated circuit (ASIC), a field programmable gate array (FPGA), a programmable logic device (PLD), a controller, a state machine, gated logic, discrete hardware components, or a combination of the foregoing. One or more sequences of instructions may be stored as firmware on ROM within controller 501 and/or its processor. One or more sequences of instructions may be software stored and read from storage medium 502, flash memory 503, or received from host device 504 (e.g., via host interface 505). ROM, storage medium 502, flash memory 503, represent examples of machine or computer readable media on which instructions/code executable by controller 501 and/or its processor may be stored. Machine or computer readable media may generally refer to any medium or media used to provide instructions to controller 501 and/or its processor, including volatile media, such as dynamic memory used for storage media 502 or for buffers within controller 501, and non-volatile media, such as electronic media, optical media, and magnetic media.

In some aspects, controller 501 may be configured to store data received from a host device 504 in flash memory 503 in response to a write command from host device 504. Controller 501 is further configured to read data stored in flash memory 503 and to transfer the read data to host device 504 in response to a read command from host device 504. As will be described in more detail below, controller 501 is also configured to predict when current read levels and/or settings are suspect and to estimate new read levels when it is predicted that the current read levels and/or settings need to be changed. If the estimated read levels are proven to be insufficient, controller 501 may be configured to perform further iterative adjustments to correct the read level parameters. By dynamically adjusting read levels of the memory 503, the subject technology may extend the number of program/erase operations that may be performed on memory cells within flash memory 503 in a particular application environment, and increase the endurance of the memory cells compared to the same application environment operating without the ability to dynamically adjust read levels.

Host device 504 represents any device configured to be coupled to data storage system 500 and to store data in data storage system 500. Host device 504 may be a computing system such as a personal computer, a server, a workstation, a laptop computer, PDA, smart phone, and the like. Alternatively, host device 504 may be an electronic device such as a digital camera, a digital audio player, a digital video recorder, and the like.

In some aspects, storage medium 502 represents volatile memory used to temporarily store data and information used to manage data storage system 500. According to aspects of the subject technology, storage medium 502 is random access memory (RAM) such as double data rate (DDR) RAM. Other types of RAM also may be used to implement storage medium 502. Memory 502 may be implemented using a single RAM module or multiple RAM modules. While storage medium 502 is depicted as being distinct from controller 501, those skilled in the art will recognize that storage medium 502 may be incorporated into controller 501 without departing from the scope of the subject technology. Alternatively, storage medium 502 may be a non-volatile memory such as a magnetic disk, flash memory, peripheral SSD, and the like.

As further depicted in FIG. 5, data storage system 500 may also include host interface 505. Host interface 505 may be configured to be operably coupled (e.g., by wired or wireless connection) to host device 504, to receive data from host device 504 and to send data to host device 504. Host interface 505 may include electrical and physical connections, or a wireless connection, for operably coupling host device 504 to controller 501 (e.g., via the I/O interface of controller 501). Host interface 505 may be configured to communicate data, addresses, and control signals between host device 504 and controller 501. Alternatively, the I/O interface of controller 501 may include and/or be combined with host interface 505. Host interface 505 may be configured to implement a standard interface, such as Serial-Attached SCSI (SAS), Fiber Channel interface, PCI Express (PCIe), SATA, USB, and the like. Host interface 505 may be configured to implement only one interface. Alternatively, host interface 505 (and/or the I/O interface of controller 501) may be configured to implement multiple interfaces, which may be individually selectable using a configuration parameter selected by a user or programmed at the time of assembly. Host interface 505 may include one or more buffers for buffering transmissions between host device 504 and controller 501.

Flash memory 503 represents a non-volatile memory device for storing data. According to aspects of the subject technology, flash memory 503 includes, for example, a NAND flash memory. Flash memory 503 may include a single flash memory device or chip, or, as depicted by FIG. 5, may include multiple flash memory devices or chips arranged in multiple channels. Flash memory 503 is not limited to any particular capacity or configuration. For example, the number of physical blocks, the number of physical pages per physical block, the number of sectors per physical page, and the size of the sectors may vary within the scope of the subject technology.

Flash memory may have a standard interface specification so that chips from multiple manufacturers can be used interchangeably (at least to a large degree). The interface hides the inner working of the flash and returns only internally detected bit values for data. In aspects, the interface of flash memory 503 is used to access one or more internal registers 506 and an internal flash controller 507 for communication by external devices. In some aspects, registers 506 may include address, command, and/or data registers, which internally retrieve and output the necessary data to and from a NAND memory cell array 508. For example, a data register may include data to be stored in memory array 508, or data after a fetch from memory array 508, and may also be used for temporary data storage and/or act like a buffer. An address register may store the memory address from which data will be fetched to host 504 or the address to which data will be sent and stored. In some aspects, a command register is included to control parity, interrupt control, and the like. In some aspects, internal flash controller 507 is accessible via a control register to control the general behavior of flash memory 503. Internal flash controller 507 and/or the control register may control the number of stop bits, word length, receiver clock source, and may also control switching the addressing mode, paging control, coprocessor control, and the like.

In some aspects, registers 506 may also include a test register. The test register may be accessed by specific addresses and/or data combinations provided at the interface of flash memory 503 (e.g., by specialized software provided by the manufacturer to perform various tests on the internal components of the flash memory). In further aspects, the test register may be used to access and/or modify other internal registers, for example the command and/or control registers. In some aspects, test modes accessible via the test register may be used to input or modify certain programming conditions of flash memory 503 (e.g., read levels) to dynamically vary how data is read from the memory cells of memory arrays 508.

It should be understood that in all cases data may not always be the result of a command received from host 504 and/or returned to host 504. In some aspects, Controller 501 may be configured to execute a read operation independent of host 504 (e.g., to verify read levels or BER). The predicate words "configured to", "operable to", and "programmed to" as used herein do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

In one or more examples, controller 501 may include hardware circuit 310A, hardware circuit 310B and comparator 350. Registers 506 may include ADL 132, BDL 134, CDL 136 and TDL 142. Controller 507 may perform the operations identified in blocks 411-414. Controller 501 may perform the operations identified in blocks 415 and 416. Controller 501 may cause the operations identified in blocks 411-414 to occur, or controller 501 may provide instructions to cause or facilitate controller 507 (and registers 506) to perform operations identified in blocks 411-414.

In one or more examples, controller 507 may include hardware circuit 310A, hardware circuit 310B and comparator 350. Registers 506 may include ADL 132, BDL 134, CDL 136 and TDL 142. Controller 507 may perform the operations identified in blocks 411-416. Controller 507 may provide instructions to cause registers 506 to perform the operation identified in block 414.

In one or more examples, the functionality of hardware circuit 310A, hardware circuit 310B and comparator 350 may be implemented as software and may be stored in storage medium 502. In one or more examples, functionality of hardware circuit 310A, hardware circuit 310B and comparator 350 may be implemented as a combination of software (in storage medium 502) and hardware in controller 501. The instructions, which cause or facilitate controller 507 (and registers 506) to perform operations identified in blocks 411-414 or 411-416, may be stored in storage medium 502. Controller 501 may execute instructions stored in storage medium 502.

In one or more examples, controller 501 may include, generate, provide, cause storing of, or receive risk threshold 340 and/or health signal 360. In one or more examples, controller 507 may include, generate, provide, cause storing of, or receive risk threshold 340 and/or health signal 360. In one or more other examples, controller 501 or storage medium 502 (instead of or in addition to registers 506) may include ADL 132, BDL 134, CDL 136 and TDL 142.

One or more aspects of the subject technology provide methods to predict failure by cell probing. According to some aspects, a method may include receiving a write request. The method may also include applying a predetermined number of programming pulses to a plurality of memory cells within a block of a flash memory device. The method may also include applying a verify pulse to each respective one of the plurality of memory cells. The method may also include storing programming status of the plurality of memory cells into a set of latches. The method may also include determining, based on the stored programming status, a total number of memory cells within the block that fall outside of one or more predetermined expected ranges. The method may also include identifying the block as a block in risk when the total number of memory cells exceeds a predetermined risk threshold.

In other aspects, a storage device may include an array of memory cells having a plurality of blocks, a plurality of latches coupled to the array of memory cells, and a controller coupled to the array of memory cells and the plurality of latches. The controller may be configured to cause receiving a write request for a block of the plurality of blocks. The controller may also be configured to cause applying a predetermined number of programming pulses to a plurality of memory cells within the block. The controller may also be configured to cause applying a verify pulse to each respective one of the plurality of memory cells. The controller may also be configured to cause storing programming status of the plurality of memory cells into one or more of the plurality of latches. The controller may also be configured to cause determining, based on the stored programming status, a total number of memory cells within the block that fall outside of one or more predetermined expected ranges. The controller may also be configured to cause identifying the block as a block in risk when the total number of memory cells exceeds a predetermined risk threshold.

In further aspects, a storage system may include a first controller and a plurality of flash memory devices coupled to the first controller. Each of the plurality of flash memory devices may include an array of memory cells having a plurality of blocks. Each of the plurality of flash memory devices may also include a plurality of latches coupled to the array of memory cells. Each of the plurality of flash memory devices may also include a controller coupled to the array of memory cells and the plurality of latches. The controller of each of the plurality of flash memory devices may be configured to cause receiving a write request for a block of the plurality of blocks. The controller of each of the plurality of flash memory devices may also be configured to cause applying a predetermined number of programming pulses to a plurality of memory cells within the block. The controller of each of the plurality of flash memory devices may also be configured to cause applying a verify pulse to each respective one of the plurality of memory cells. The controller of each of the plurality of flash memory devices may also be configured to cause storing programming status of the plurality of memory cells into one or more of the plurality of latches. The controller of each of the plurality of flash memory devices may also be configured to cause determining, based on the stored programming status, a total number of memory cells within the block that fall outside of one or more predetermined expected ranges. The controller of each of the plurality of flash memory devices may also be configured to cause identifying the block as a block in risk when the total number of memory cells exceeds a predetermined risk threshold.

In further aspects, a system may include means for receiving a write request. The system may also include means for applying a predetermined number of programming pulses to a plurality of memory cells within a block of a flash memory device. The system may also include means for applying a verify pulse to each respective one of the plurality of memory cells. The system may also include means for storing programming status of the plurality of memory cells into a set of latches. The system may also include means for determining, based on the stored programming status, a total number of memory cells within the block that fall outside of one or more predetermined expected ranges. The system may also include means for identifying the block as a block in risk when the total number of memory cells exceeds a predetermined risk threshold.

It is understood that other configurations of the subject technology will become readily apparent to those skilled in the art from the detailed description herein, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject technology.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such as an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a "configuration" may refer to one or more configurations and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A method, comprising:
   receiving a write request;
   applying a predetermined number of programming pulses to a plurality of memory cells within a block of a flash memory device;
   applying a verify pulse to each respective one of the plurality of memory cells;
   storing programming status of the plurality of memory cells into a set of latches;
   determining, based on the stored programming status, a total number of memory cells within the block that fall outside of one or more predetermined expected ranges;
   determining that the total number of memory cells satisfies a predetermined risk threshold; and
   identifying the block as a block in risk in response to the determining that the total number of memory cells satisfies the predetermined risk threshold.

2. The method of claim 1, wherein the one or more predetermined expected ranges comprise one or more predetermined voltage ranges.

3. The method of claim 2, wherein the one or more predetermined voltage ranges are based on a wear level for the block.

4. The method of claim 1, wherein determining the total number of memory cells comprises:
   causing one or more hardware circuits to track, after each application of a verify pulse, the total number of memory cells within the block that fall outside of the one or more predetermined expected ranges.

5. The method of claim 4, wherein the one or more hardware circuits are one or more hardware counters that are coupled to at least one of the set of latches.

6. The method of claim 4, wherein the one or more hardware circuits increment the total number of memory cells when at least one of the set of latches indicates an inhibited cell in the plurality of memory cells.

7. The method of claim 1, wherein determining the total number of memory cells comprises:
   identifying a quick pass write (QPW) cell in the plurality of memory cells; and
   incrementing a value stored in a counter coupled to at least one of the set of latches.

8. The method of claim 1, wherein identifying the block as the block in risk comprises writing information to a metadata area in the block of the flash memory device.

9. The method of claim 1, further comprising:
   identifying the block as usable when the total number of memory cells does not satisfy the predetermined risk threshold;
   determining whether a wear level of the block satisfies an end of life threshold; and
   postponing a retirement of the block based on identifying the block as usable and determining the wear level of the block satisfies the end of life threshold.

10. The method of claim 1, further comprising:
    in response to identifying the block as the block in risk, relocating data stored in the block in risk to a usable block in the flash memory device.

11. A storage system, comprising:
    a first controller; and
    a plurality of flash memory devices coupled to the first controller, each of the plurality of flash memory devices comprising:
      an array of memory cells having a plurality of blocks;
      a plurality of latches coupled to the array of memory cells; and
      a second controller coupled to the array of memory cells and the plurality of latches, the second controller configured to cause:
        receiving a write request;
        applying a predetermined number of programming pulses to a plurality of memory cells within one of the plurality of blocks;
        applying a verify pulse to each respective one of the plurality of memory cells; and
        storing programming status of the plurality of memory cells into one or more of the plurality of latches,
      wherein the first controller is configured to cause:
        determining, based on the stored programming status, a total number of memory cells within the one of the plurality of blocks that fall outside of one or more predetermined expected ranges; and
        identifying the one of the plurality of blocks as a block in risk when the total number of memory cells satisfies a predetermined risk threshold.

12. The storage system of claim 11, wherein the first controller is configured to cause determining the total number of memory cells by:
    causing one or more hardware circuits to track, after each application of a verify pulse, the total number of memory cells within the block that fall outside of one or more predetermined voltage ranges.

13. The storage system of claim 12, wherein the one or more hardware circuits are one or more hardware counters that are coupled to at least one of the plurality of latches.

14. The storage system of claim 11, wherein the second controller of each of the plurality of flash memory devices is configured to cause:
  after the one of the plurality of blocks is identified as the block in risk, relocating data stored in the block in risk to a usable block in the associated flash memory device.

15. An apparatus, comprising:
  a storage medium; and
  a controller coupled to the storage medium and configured to cause:
    issuing one or more requests for programming, wherein the issuing comprises:
      causing a predetermined number of programming pulses to drive a plurality of memory cells within a block of a flash memory device;
      causing a verify pulse to drive each respective one of the plurality of memory cells; and
      causing programming status of the plurality of memory cells to be stored in a set of latches;
    determining, based on the stored programming status, a total number of memory cells within the block that fall outside of one or more predetermined expected ranges; and
    identifying the block as a block in risk when the total number of memory cells satisfies a predetermined risk threshold.

16. The apparatus of claim 15, wherein the controller is configured to cause determining the total number of memory cells by:
  causing one or more hardware circuits to track, after each application of a verify pulse, the total number of memory cells within the block that fall outside of the one or more predetermined expected ranges.

17. A non-transitory machine-readable medium including machine-executable instructions thereon that, when executed by a processor, perform a method comprising:
  issuing one or more requests for programming, wherein the issuing comprises:
    causing a predetermined number of programming pulses to drive a plurality of memory cells within a block of a flash memory device;
    causing a verify pulse to drive each respective one of the plurality of memory cells; and
    causing programming status of the plurality of memory cells to be stored in a set of latches;
  determining, based on the stored programming status, a total number of memory cells within the block that fall outside of one or more predetermined expected ranges; and
  identifying the block as a block in risk when the total number of memory cells satisfies a predetermined risk threshold.

18. The non-transitory machine-readable medium of claim 17, wherein determining the total number of memory cells comprises causing one or more hardware circuits to track, after each application of a verify pulse, the total number of memory cells within the block that fall outside of the one or more predetermined expected ranges.

19. An apparatus, comprising:
  means for issuing one or more requests for programming, wherein the means for issuing comprises:
    means for causing a predetermined number of programming pulses to drive a plurality of memory cells within a block of a flash memory device;
    means for causing a verify pulse to drive each respective one of the plurality of memory cells; and
    means for causing programming status of the plurality of memory cells to be stored in a set of latches;
  means for determining, based on the stored programming status, a total number of memory cells within the block that fall outside of one or more predetermined expected ranges; and
  means for identifying the block as a block in risk when the total number of memory cells satisfies a predetermined risk threshold.

20. The apparatus of claim 19, wherein the means for determining is configured to cause one or more hardware circuits to track, after each application of a verify pulse, the total number of memory cells within the block that fall outside of the one or more predetermined expected ranges.

* * * * *